United States Patent
Chang et al.

(10) Patent No.: US 7,678,623 B2
(45) Date of Patent: Mar. 16, 2010

(54) STAGGERED SOURCE/DRAIN AND THIN-CHANNEL TFT STRUCTURE AND FABRICATION METHOD THEREOF

(75) Inventors: Kow-Ming Chang, Hsinchu (TW); Gin-Min Lin, Yilan (TW)

(73) Assignee: National Chiao-Tung University, Hsinchu (TW)

( * ) Notice: Subject to any disclaimer, the term of this patent is extended or adjusted under 35 U.S.C. 154(b) by 688 days.

(21) Appl. No.: 11/410,168

(22) Filed: Apr. 24, 2006

(65) Prior Publication Data

US 2007/0161161 A1    Jul. 12, 2007

(30) Foreign Application Priority Data

Jan. 9, 2006    (TW)    ............... 95100731 A

(51) Int. Cl.
*H01L 21/00* (2006.01)

(52) U.S. Cl. ............... 438/151; 438/164; 438/166

(58) Field of Classification Search ............... 438/149, 438/151, 161, 164, 166
See application file for complete search history.

(56) References Cited

U.S. PATENT DOCUMENTS

2008/0280402 A1* 11/2008 Moriwaka ............... 438/164

OTHER PUBLICATIONS

Po-Sheng Shih, Chun-Yen Chang, Ting-Chang Chang, Tiao-Yuan Huang, Du-Zen Peng, and Ching-Fa Yeh, "A novel lightly doped drain polysilicon thin-film transistor with oxide sidewall spacer formed by one-step selective liquid phase deposition", IEEE Electron Device Letters, vol. 20, No. 8, pp. 421-423, Aug. 1999.(Enclosed).

Kwon-Yourig Choi, and Min-Koo Han, A novel gate-overlapped LDD poly-Si thin film transistor IEEE Electron Device Letters, vol. 17, No. 12, pp. 566-568. Dec. 1996. (Enclosed).

Kenji Sera, Fujio Oicumura, Hiroyuki Uchida, Shinji Itoh, Setsuo Kaneko, and Kazuaki Hotta, "High-performance TFT'S fabricated by XeCI excimer laser annealing of hydrogenated amorphous-silicon film", IEEE Trans. On Electron Devices, vol. 36, No. 12, pp. 2868-2872, Dec. 1989. (Enclosed).

* cited by examiner

*Primary Examiner*—Jack Chen
(74) *Attorney, Agent, or Firm*—Bucknan and Archer

(57) ABSTRACT

This invention relates to a process for fabricating a staggered source/drain and thin-channel TFT structure, which simplifies the conventional process for fabricating the structure by decreasing the number of mask steps and achieving better results at suppressing the electric field near the drain junction and reducing the leakage current. The process comprises (1) re-crystallizing a-Si into poly-Si (02), which is performed by depositing an a-Si layer on a substrate and then applying a general photolithographic step and a RIE etching step for defining the amorphous Si islands provided with higher regions and lower regions, wherein the residual width of the thin channel of the a-Si is about 5 to 200 nm after etching; then the a-Si is changed into poly-Si (02) after a subsequent annealing; (2) defining the gate region (05), source/drain region (07) and the channel; (3) applying the implantation; and (4) applying the connection.

8 Claims, 5 Drawing Sheets

First Masking Step

Second Masking Step

Third Masking Step

Fourth Masking Step

Fifth Masking Step

STAGGERED SOURCE/DRAIN AND THIN-CHANNEL TFT STRUCTURE AND FABRICATION METHOD THEREOF

TECHNICAL FIELD

This invention relates to a type of stacked source/drain and thin-channel TFT (thin film transistor) structure and fabrication method thereof, and it can be used with various traditional a-Si and poly-Si TFT applications, whereby the electrical properties and reliability of the transistor are improved, thereby obtaining TFT with low electric current leakage and high field-effect mobility.

BACKGROUND OF THE INVENTION

With regards to auxiliary equipments with high field-effect mobility requirements in a-Si and poly-Si TFT applications, such as a video scanner, the poly-Si TFT has a significant advantage.

The traditional poly-Si TFT inherently has relatively larger crystal particles and therefore has a relatively higher electron mobility. However, when the circuit is cut-off, there is also a relatively higher amount of electric current leakage, and the electric current leakage of poly-Si TFT relative to that a-Si TFT has already exceeded the acceptable limit for applications with LCD (Liquid Crystal Display) products.

Investigations have shown that the reasons for the electric current leakage in low-temperature poly-Si TFT structures can be attributed to defects in the particle boundaries and the hole current that is generated at the high electric field near the drain. Therefore, reducing the defects in the particle boundaries and lowering the high electric field near the drain would be able to achieve the objective of controlling the electric current leakage.

Currently, the known techniques for solving the aforesaid problem include: (1) offset gate structure, (2) lightly dopant drain or LDD structure, and (3) stack source/drain structure). Examples have been introduced in the articles by Po-Sheng Shih et al., ("A novel lightly doped drain polysilicon thin-film transistor with oxide sidewall spacer formed by one-step selective liquid phase deposition", IEEE Electron Device Letters, vol. 20, pp. 421-423, August 1999) and Kenji Sera et al., ("High-Performance TFTs Fabricated by XeCl Ecimer Laser Annealing of Hydrogenated Amorphous-Silicon Film", IEEE Electron Device Letters, vol. 36, no. 12, pp. 2868-2872, December 1989). These methods to lower the high electric current leakage in poly-Si TFT structures are able to increase the on/off current ratio. However, with regards to offset gate and LDD structures, due to the fact that the aforesaid methods involve an extra step of ion implantation, the components easily suffer collisions with high-energy ions during the ion implantation, thus causing the drain to suffer damage. This phenomenon has been disclosed in an article by Kwon-Young Choi and ors ("A novel gate-overlapped LDD poly-Si thin film transistor," IEEE Electron Device Letters, vol. 17, pp. 566-568, December 1996). In particular, such damage is irreversible in the case of low-temperature poly-Si TFT structures where the temperature is subject to restraints during production.

In the method by Kenji Sera et al. that is described above, a stagger source/drain TFT structure can be used, as shown in FIG. 1, and defined based on the number of times that the reticle is used, and there are at least 5 steps in the process, including (1) first, two independent poly-Si (02) islands are defined, and a thick staggered source/drain structure is formed on a thermal oxide (01) substrate by depositing a poly-Si (02) layer and coating photoresistor (03) and then exposed and then etched; (2) deposit the poly-Si TFT (02'), followed by coating the photoresistor (03) again, and then exposing it and etching it to form a poly-Si (02) channel region; (3) defining the gate of poly-Si and deposit the gate oxide (04) film and poly-Si TFT (02"), followed by coating the photoresistor (03) again and then exposing and etching; (4) define the metal conductor line (10) contact window (14) region; and (5) defining the metal conductor line (10) region at the external connection for the component.

Although it is known that the method by Kenji Sera et al. is able to achieve a relatively good electric performance, when compared with the standard four mask steps for traditional co-plannar components, there is now an extra step and thereby makes the process more complicated. Besides the production costs, the extra step in the process also increases the errors when switching between images. It is therefore not suitable for mass production of TFT-LCD products.

SUMMARY OF INVENTION

The objective of the present invention is to provide a method of manufacturing a type of TFT structure that is simple to manufacture and which can effectively lower the high electric field near to the drain and is able to reduce the amount of electric current leakage. It seeks to improve on the method by Kenji Sera et al, using a thicker source/drain structure to reduce the amount of electric current leakage, and without the complexity of the aforesaid process, and allowing for the application of the mass production of TFT-LCD products.

The method in the present invention for manufacturing the aforesaid TFT structure is shown in FIG. 2, and is defined based on the number of times that the reticle is used, and the steps comprise: (1) Provide a substrate and re-crystallize an a-Si layer to form a poly-Si layer (12), first deposit an a-Si layer on a substrate, followed by coating a photoresistor (03), and then carrying out exposure and etching to form an a-Si island with higher regions and lower regions, followed by carrying out annealing, in order to re-crystallize the a-Si layer to form a poly-Si layer; (2) defining the gates (05), source/drain structure (07) and channel region, stack the gate oxide layer (04) and the poly-Si (12') gate film, followed by coating a photoresistor (03), and then carrying out exposure and etching and defining the position and size of the gates (05), source/drain structure (07) and channel region; (3) implantation step, use the ion implantation technique to form the high doping gates (05), source/drain region (07), and carry out ion activation using a high-temperature stove pipe; and (4) connection step, deposit the $SiO_2$ protection layer and open the contact window (14), and carry out the connection of the aluminum conductor line (13).

An alternative for step (1) in the manufacturing method in the present invention is as follows: first deposit a a-Si layer on the substrate, followed by coating a photoresistor (03), and then carrying out exposure and etching to form the positions and sizes of two a-Si islands; and then deposit another a-Si layer, followed by coating a photoresistor (03), and then carrying out exposure and etching, and joining the two independent a-Si islands together; finally, carry out annealing, in order to re-crystallize the aforesaid a-Si layers to form a poly-Si (12') layer.

Based on the aforesaid concept, wherein one of the substrates is a glass substrate (11).

Based on the aforesaid concept, wherein the deposit of the a-Si layer in step 1 can make use of a LPCVD, PECVD or ECR-CVD system, while the preferred etching technique is the RIE etching technique; and the preferred re-crystallization method is the solid-phase re-crystallization method or the laser annealing method.

Based on the aforesaid concept, step (2) can make use of a PECVD or LPCVD system to carry out stacking of the gate oxide layers and the poly-Si gate regions (05), while the relatively preferred etching technique is the RIE etching technique.

Based on the aforesaid concept, for the deposit of a $SiO_2$ protection layer in step (4), it is preferred to use PECVD.

Another objective of the present invention is to provide a TFT structure that is simple and which can effectively lower the high electric field near to the drain and is able to reduce the amount of electric current leakage. The aforesaid manufacturing method is used, and when the source/drain region (07) is defined in step (1), a certain thickness of a-Si TFT must be maintained, and re-crystallization then takes place, in order to enable the stacked source/drain structure in the present invention to have an increased thickness source/drain and thin channel.

The stacked source/drain poly-Si TFT structure in the present invention comprises at least: a substrate; a source/drain layer situated on top of the base substrate; a gate conductor structure, comprising a poly-Si channel, a gate insulation layer and a gate; and metal conducting lines (10), connected respectively to the source/drain and gate conductor structure, and an insulation layer that has passivation oxide (09) is covered between them, characterized in that it has a source/drain region (07) of increased thickness and a thin channel.

The source drain with increased thickness refers to the thickness of the source drain relative to conventional co-plannar structures; the thin channel refers to the channel being 50 nm or less, or the channel being the thinner entity when compared with the source/drain thickness on both sides.

By increasing the thickness of the source/drain, the sheet resistance of the source/drain itself can be lowered, and will thus cause the serial resistance of the component to be lowered. On the other hand, when the thin channel is reversed, the reversed layer has a thickness less than 50 nm, and therefore the channel becomes thinner, and this allows the component gates to have better control of the channel. With regards to the poly-Si TFT, the thickness of the channel should be reduced, in order to reduce the effect of the defects at the channel region on the electric properties of the component.

The TFT acts as the switch component of the TFT-LCD panel and its superior electric properties will significantly enhance the display quality of the TFT-LCD panel. The novel stacked increased height source/drain and thin channel structure in the present invention can be used in the manufacture of a-Si and poly-Si TFT products, and is able to significantly improve the electron mobility, lower the electric current leakage and increase the reliability of the component, thereby increasing the contrast, resolution and display speed. In addition, the novel stacked increased height source/drain and thin channel structure in the present invention only require four traditional optical lithography steps, and with the already defined gates as the reticles, the definition of the source/drain region and the channel region is continuously completed, and the complexity of the process is not increased. It is therefore very suitable for use in the mass production of large TFT-LCD panels.

BRIEF DESCRIPTION OF DRAWINGS

The invention will be more clearly understood after referring to the following detailed description read in conjunction with the drawings wherein.

2(a') refers to the definition of two independent a-Si islands on the glass substrate (11), and the further deposit of an a-Si layer and joining them together, followed by crystallization to form poly-Si (02);

2(b) refers to the implementation of the definition step;

2(c) refers to the implementation of the implantation step;

2(d) refers to the implementation of the connection step;

2(e) refers to the top-view diagram of the completed structure and the important parameters of the component.

Figure 3:
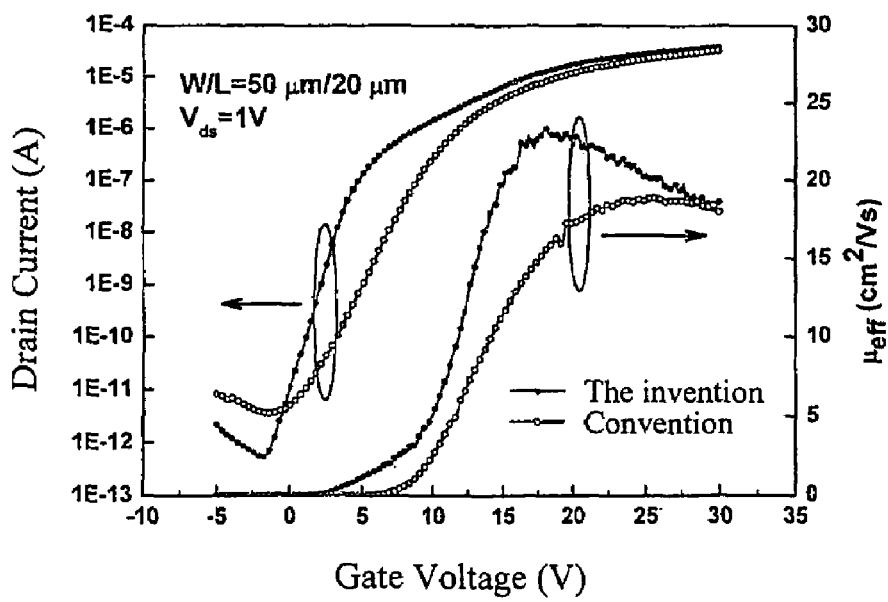

FIG. 3 is the $I_D$-$V_G$ switching graph for TFT in the present invention and conventional TFT, and the comparison chart for field effect mobility.

DETAILED DESCRIPTION OF PREFERRED EMBODIMENTS

The TFT with stacked increased thickness source/drain and thin channel in the present invention is characterized in that only four steps are required in the manufacturing process, the crystallization step, the definition step, the implantation step and the connection step.

We refer to the following embodiments to provide a more detailed explanation of the present invention.

Embodiment 1

Figure 1:
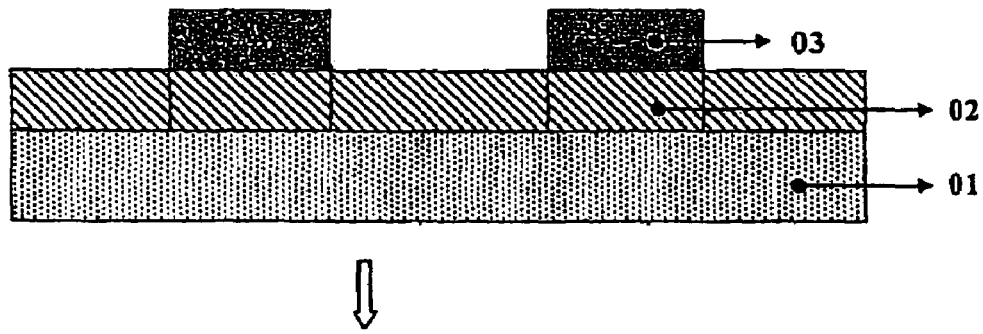
FIG. 1 refers to the manufacturing flow diagram for conventional stacked source/drain TFT structures, comprising five mask steps.
Figure 1:
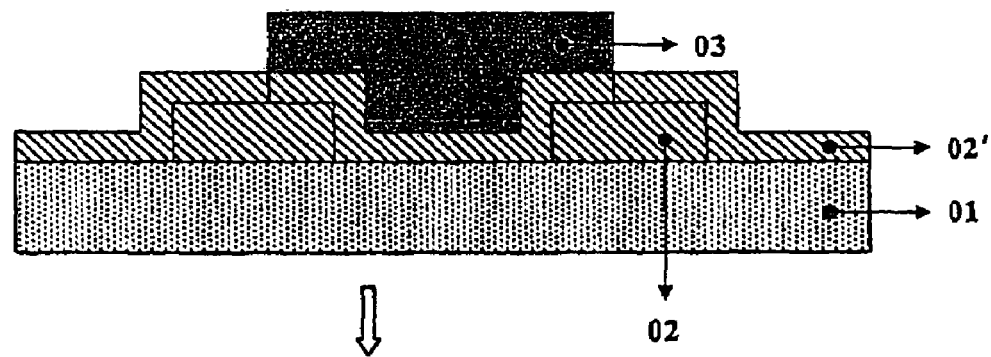
Figure 1:
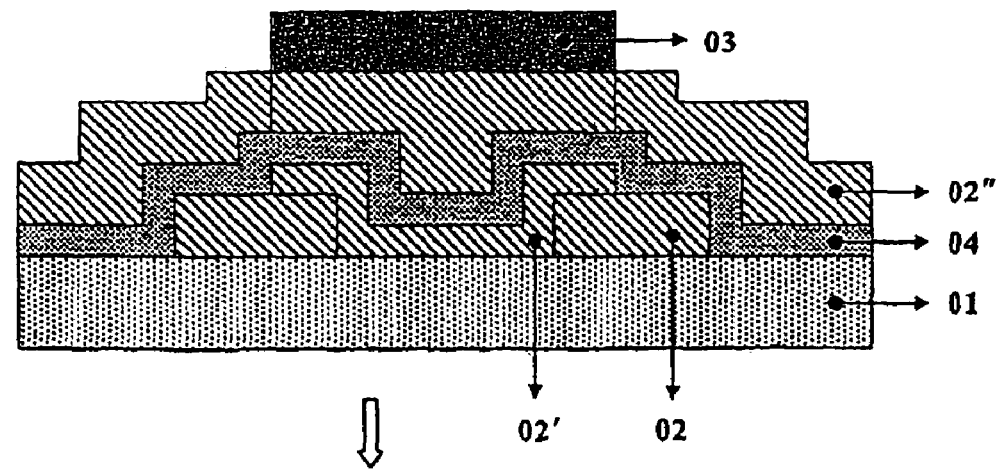
Figure 1:
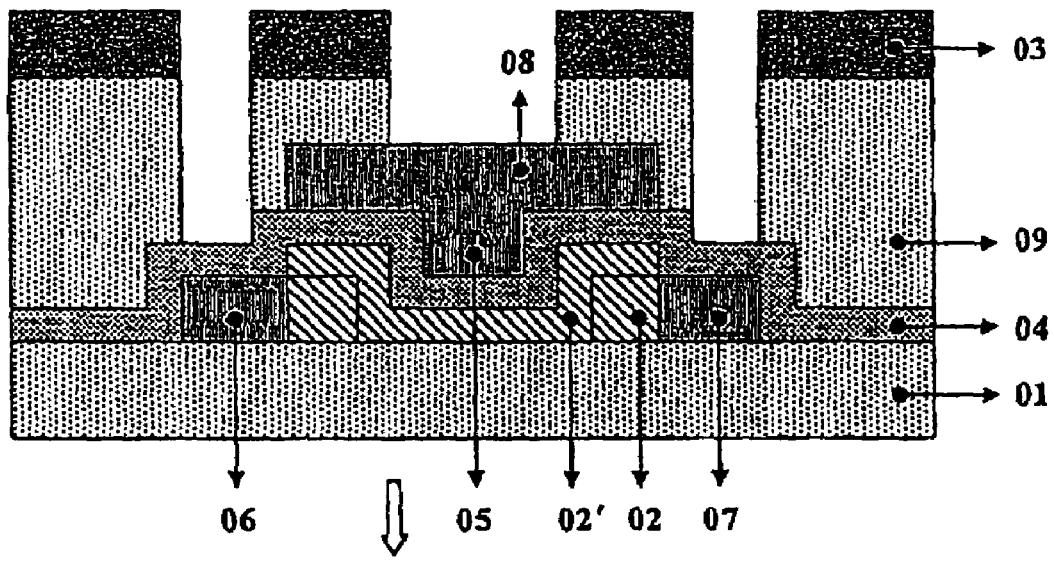
Figure 1:
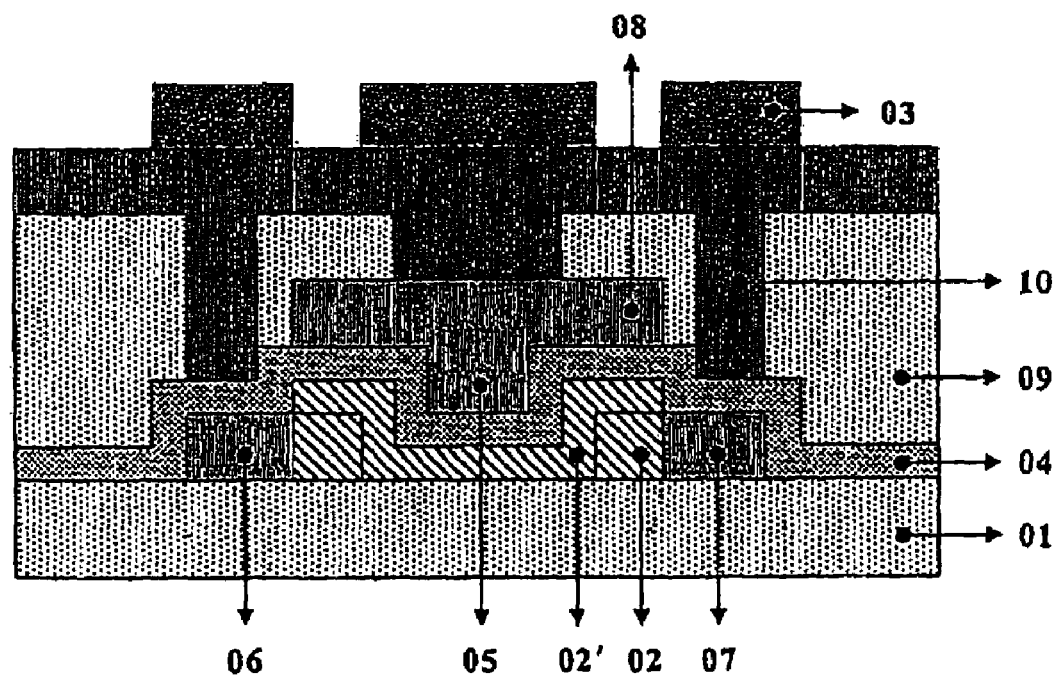
Figure 2A:
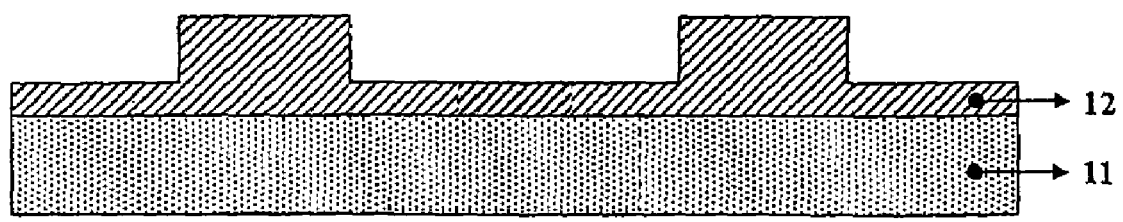
FIG. 2 refers to the manufacturing flow diagram for stacked source/drain TFT structures in the present invention, wherein 2(a) refers to the deposit of an a-Si layer on the glass substrate (11) and its crystallization to form a poly-Si (02)

First, as shown in FIG. 2(a), on a glass substrate (11), a LPCVD system is used to deposit an a-Si thin film with a thickness of 100-500 nm, with the equipment power set at 30-600 W. The operating conditions are as follows: process temperature is approximately 100-600° C., the silicon source that is used is $SiH_4/Si_2H_6$ gas, the volume flow is approximately 10-200 sccm, while the flow volume of $O_2/N_2$ gas is approximately 10-200 scmm, the pressure in the production chamber is maintained at 5-300 mTorr. After that, a general optical exposure is carried out and RIE etching technique is used, defining the position and size of a-Si islands with higher regions and lower regions, and the thickness of the a-Si thin channel region that has been etched is reduced to 5-200 nm. Finally, laser annealing is used to re-crystallize the a-Si layer to form a poly-Si layer (02).

Figure 2B:
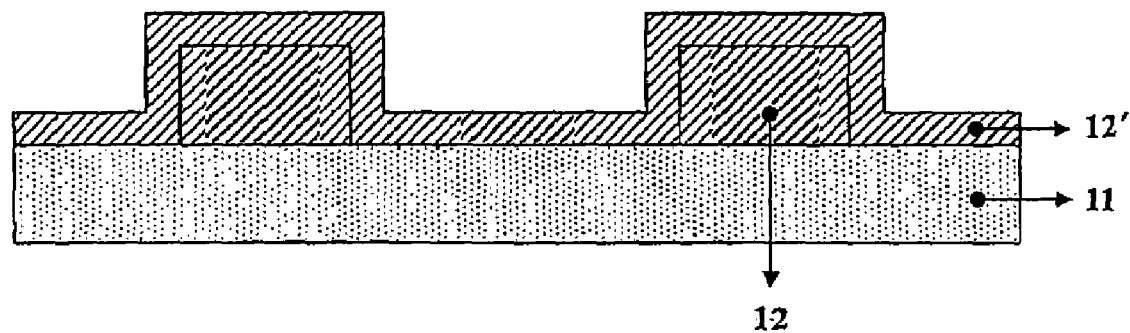
Figure 2B:
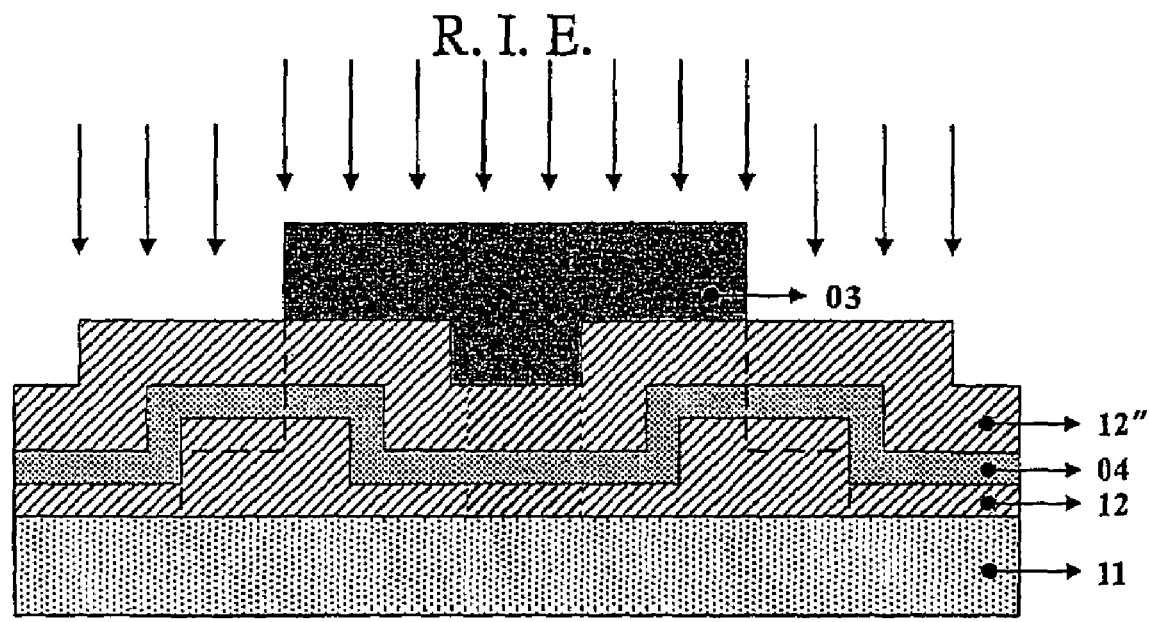

FIG. 2(b) shows the implementation of the definition step, wherein a PECVD and LPCVD system are respectively used to stack the gate oxide layer and poly-Si gate region (05), and a general optical exposure is carried out and RIE etching technique is used, and after defining the gate region (05), a gate photoresistor (03) is used as a resistance layer, and the source/drain region (07) and thin channel region are etched out, and the separation region between the components is completed.

Figure 2C:
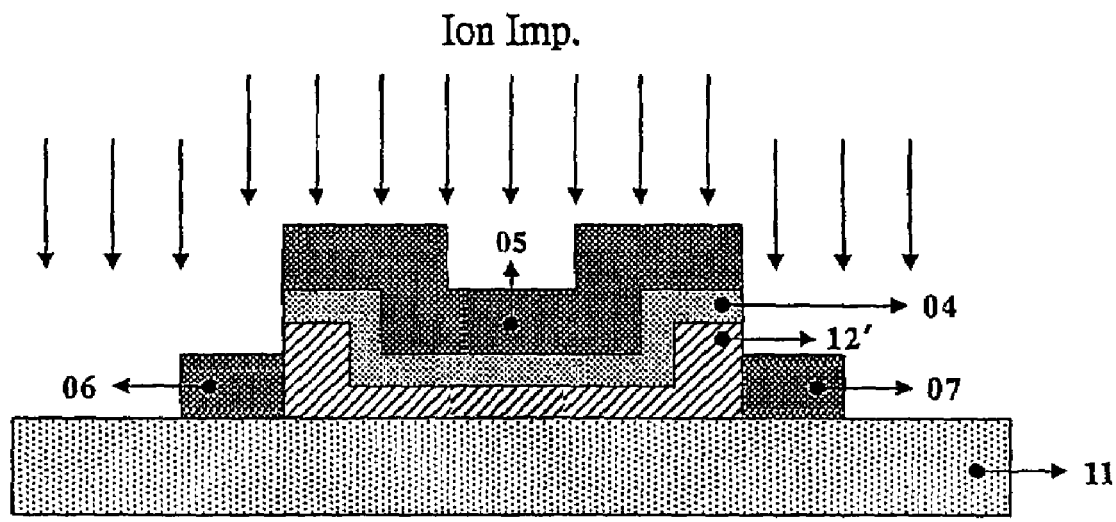

FIG. 2(c) shows the implementation of the implantation step. Ion implantation is used, completing self-aligned of the heavy doped gate and source/drain region (07), and ionic activation is carried out using a high temperature stove pipe or laser.

For the aforesaid definition and implantation steps, the PECVD and LPCVD technology can be replaced with high-density plasma apparatus technologies such as ECR-CVD and ICP.

Figure 2D:
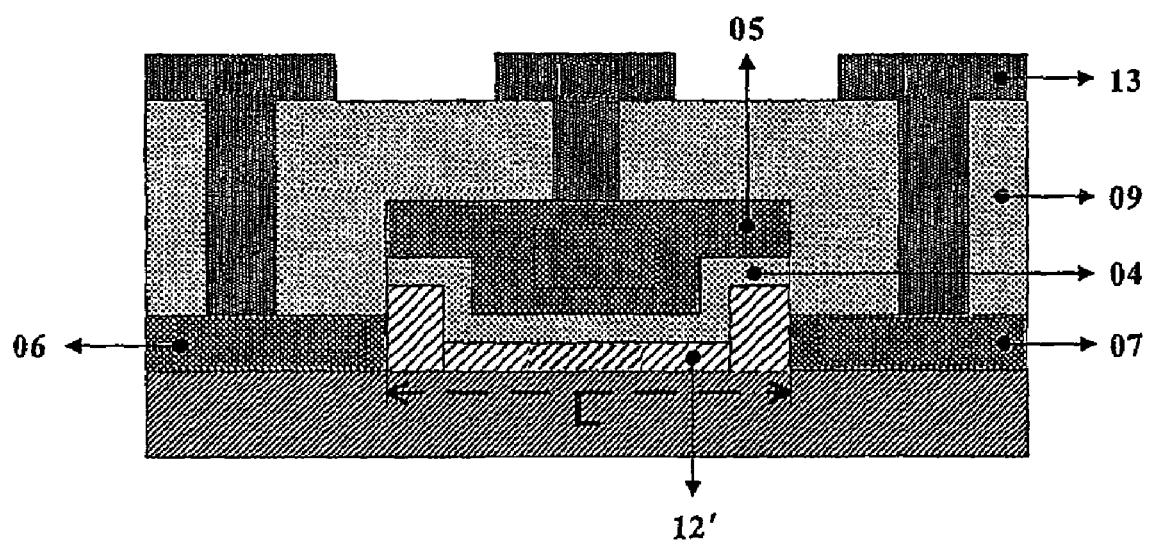

FIG. 2(d) shows the implementation of the connection step. PECVD is used to deposit the SiO$_2$ protection layer and open the contact window (14), and carry out the connection of the aluminum conducting line (13), thereby completing the production of the novel stacked gate oxide layer TFT. In FIG. 2(d), the gate photoresistor (03) region is used for the over etching of the source/drain region (07) and the channel region, and during this period, there will be a channel region with the same region at the lower side of the gate region (05) that has been defined. Thus the distribution region of the channel will depend on the pre-determined gate region. This characteristic is very important in producing performance components with high space utilization when the region is restricted.

Figure 2E:
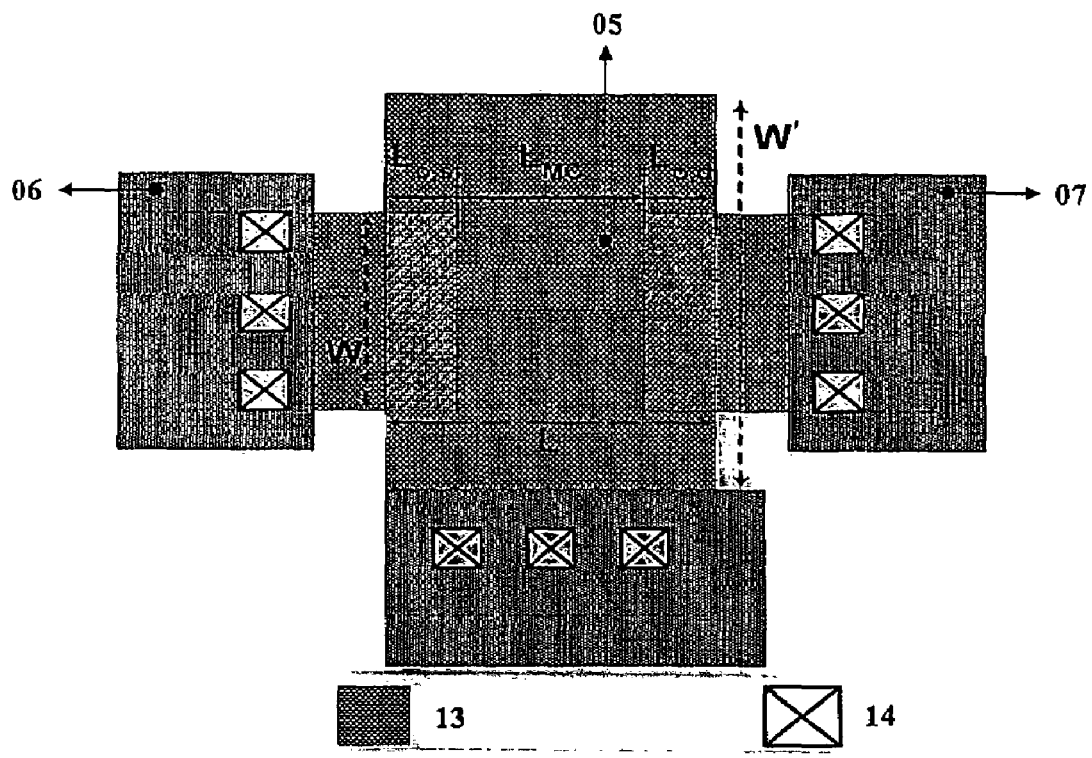

FIG. 2(e) refers to the top-view diagram of the completed structure and the important parameters of the component, wherein the parameters of the gate region (05), source/drain region (07) and thin channel region are as follows:

(1) W" (Width of gate region (05)): 0.1-200 µm
(2) W (Width of source/drain region (07) or main channel region): 0.1-200 µm
(3) L (Length of gate region (05) or overall channels): 0.065-200 µm
(4) L$_{MC}$ (Length of main channel region): 0.065-200 µm
(5) Lo.s/Lo.d (Length of channel of gate and source/drain region (07)): 0.065-100 µm Embodiment 2

FIG. 2(a') shows the second embodiment for the present invention. The main difference with the first embodiment is that when the steps in FIG. 2(a') are completed, steps 2(b) to 2(d) in the first embodiment are carried out again. First, on a glass substrate (11), a LPCVD system is used to deposit a a-Si layer, and a general optical exposure is carried out and RIE etching technique is used, defining the position and size of two independent a-Si islands, and a LPCVD system is used to stack the a-Si film, connecting the two independent a-Si islands, followed by using laser annealing to re-crystallize the a-Si layer to form a poly-Si layer (02).

The thickness and operating conditions for the first a-Si layer and the second a-Si thin film layer are as follows:

(1) Thickness of first layer of a-Si thin film deposit: 100-500 nm
(2) Thickness of second layer of a-Si thin film deposit: 5-200 nm
(3) Production power of LPCVD: 30-600 W
(4) SiH$_4$/Si$_2$H$_6$ gas flow volume of LPCVD: 10-200 sccm
(5) O$_2$/N$_2$ gas flow volume of LPCVD: 10-200 sccm
(6) Pressure of production chamber of LPCVD: 5-300 mTorr
(7) Production temperature of LPCVD: 100-600° C.

FIG. 3 is the I$_D$-V$_G$ switching graph for TFT in the present invention and conventional TFT, and the comparison chart for field-effect mobility, and it can be seen from here that the TFT in the present invention has higher current switching ratio and electron mobility than conventional TFT.

EXPLANATION OF MAIN COMPONENTS

01: Thermal oxide layer
02,02',02";12,12',12": poly-Si (layer)
03: Photoresistor
04: Gate oxide
05: Gate region
06: Source region
07: Drain region
08: Implanted poly-Si
09: Passivation oxide
10: Metal conducting line
11: Glass substrate
13: Aluminum conducting line
14: Contact window

We claim:

1. A method of manufacturing a poly-Si TET structure, wherein the structure comprises a stacked source/drain and a thin channel, wherein the steps comprise:
    (1) a step of re-crystallizing a a-Si layer to form a poly-Si layer: first, deposit an a-Si layer on-top of a substrate, followed by carrying out a general exposure lithography and using etching technique to define a-Si islands with higher regions and lower regions, followed by annealing, in order to re-crystallize the a-Si layer to form a poly-Si layer (02);
    (2) a step of defining a gate region, source/drain region and channel region: respectively stack a gate oxide layer (04) and a poly-Si thin film, followed by carrying out general lithography and using etching to define a gate region (05), source/drain region (07) and channel region;
    (3) implementation step: ionic implantation technique is used to form a heavy doped gate region (05) and source/drain region (07), and ionic activation is carried out; and
    (4) connection step: deposit a SiO$_2$ protection layer and open a contact window (14), and carry out a connection of a conducting line (10).

2. A method of manufacturing of claim 1, wherein the substrate is a glass substrate (11).

3. A method of manufacturing of claim 1, wherein the depositing of the a-Si layer in step 1 uses the LPCVD, PECVD, ECR-CVD or ICP system.

4. A method of manufacturing of claim 1, wherein the preferred etching technique for step 1 and 2 is the RIE etching technique.

5. A method of manufacturing of claim 4, wherein a residual thickness of the a-Si layer is approximately 5-200 nm after etching.

6. A method of manufacturing of claim 1, wherein the preferred method for re-crystallization in step 1 is the solid-phase re-crystallization method or the laser annealing method.

7. A method of manufacturing of claim 1, wherein a PECVD or LPCVD system can be used to carry out stack of the gate oxide layer and poly-Si gate region (05).

8. A method of manufacturing of claim 1, wherein PECVD is preferred for the depositing of the SiO$_2$ protection layer in step 4.

* * * * *